United States Patent [19]
Powers

[11] 3,942,077
[45] Mar. 2, 1976

[54] MODULAR PANEL CONSTRUCTION FOR PROGRAMMABLE CONTROLLER AND FRAME THEREFORE

[75] Inventor: Howard A. Powers, Medfield, Mass.

[73] Assignee: Modicon Corporation, Andover, Mass.

[22] Filed: Apr. 11, 1974

[21] Appl. No.: 460,037

[52] U.S. Cl. ............. 317/118; 317/101 CB; 179/98
[51] Int. Cl.² .......................................... H02B 1/04
[58] Field of Search............. 179/98; 317/99, 101 R, 317/101 CB, 101 DH, 112, 113, 118, 119

[56] References Cited
UNITED STATES PATENTS

| | | | |
|---|---|---|---|
| 3,054,023 | 9/1962 | Blecker | 317/113 |
| 3,218,518 | 11/1965 | Ashbridge | 317/101 CB |
| 3,335,326 | 8/1967 | Bonin | 317/99 |
| 3,394,287 | 7/1968 | Fitzmann | 317/99 |
| 3,517,266 | 6/1970 | Yoda | 317/99 |
| 3,604,984 | 9/1971 | Andreassen | 317/99 |
| 3,801,873 | 4/1974 | Stumpf | 317/99 |

*Primary Examiner*—Gerald P. Tolin
*Attorney, Agent, or Firm*—Mattern, Ware and Davis

[57] ABSTRACT

By providing an input/output panel housing which is readily connectible to adjacent housings and which cooperates with up to four removable input/output modules, a completely expandable, modularized input-/output panel construction is achieved. Each housing accommodates up to four "plug-in" input/output modules, and is constructed so that the wiring from the equipment being controlled is connected directly to fixed terminals and need not be removed when the input/output modules are removed or replaced. Since each housing is readily connectible to adjacent housings, the input/output panel board construction of this invention is completely flexible and readily expandable to meet any desired operational needs.

11 Claims, 10 Drawing Figures

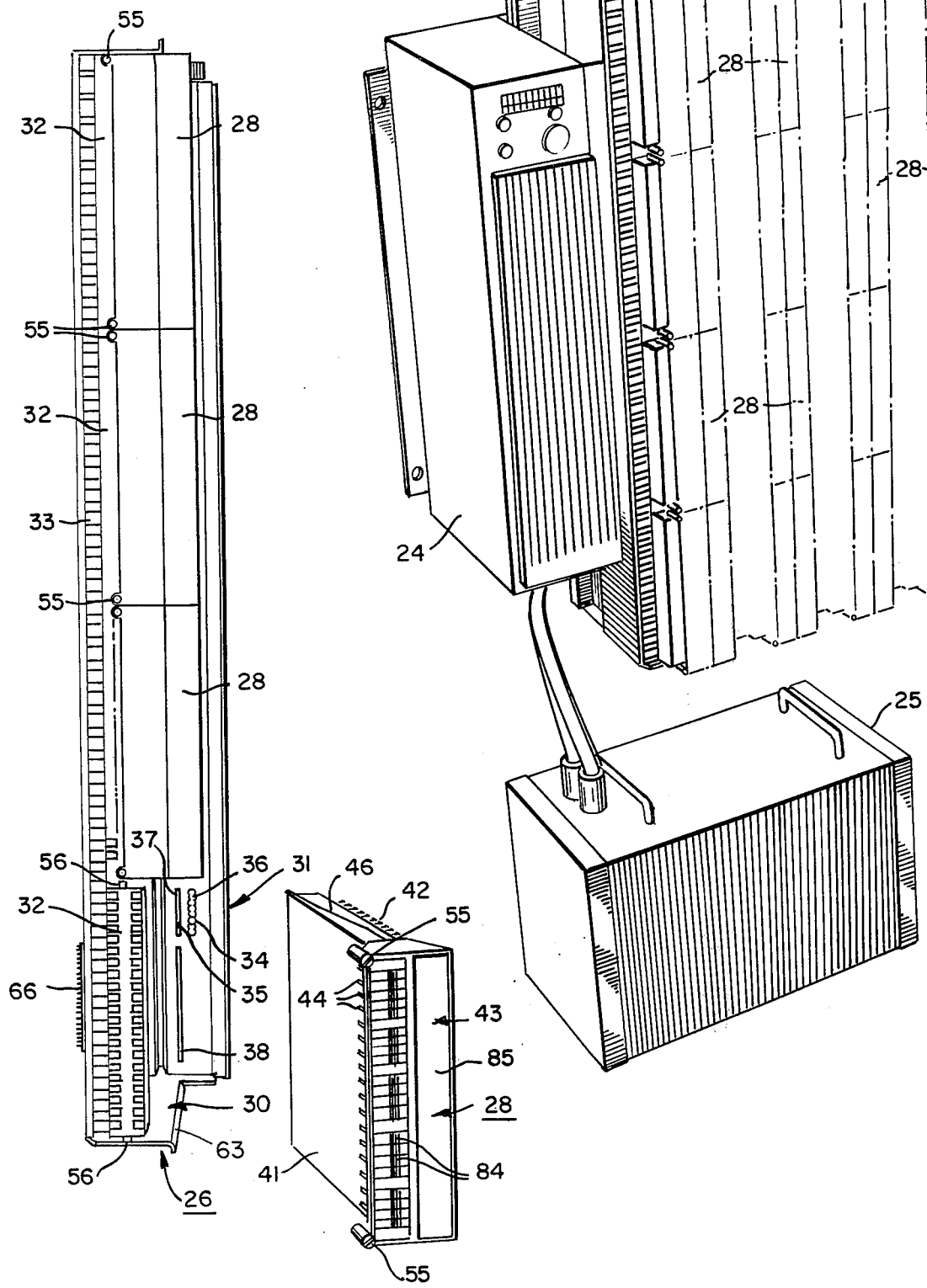

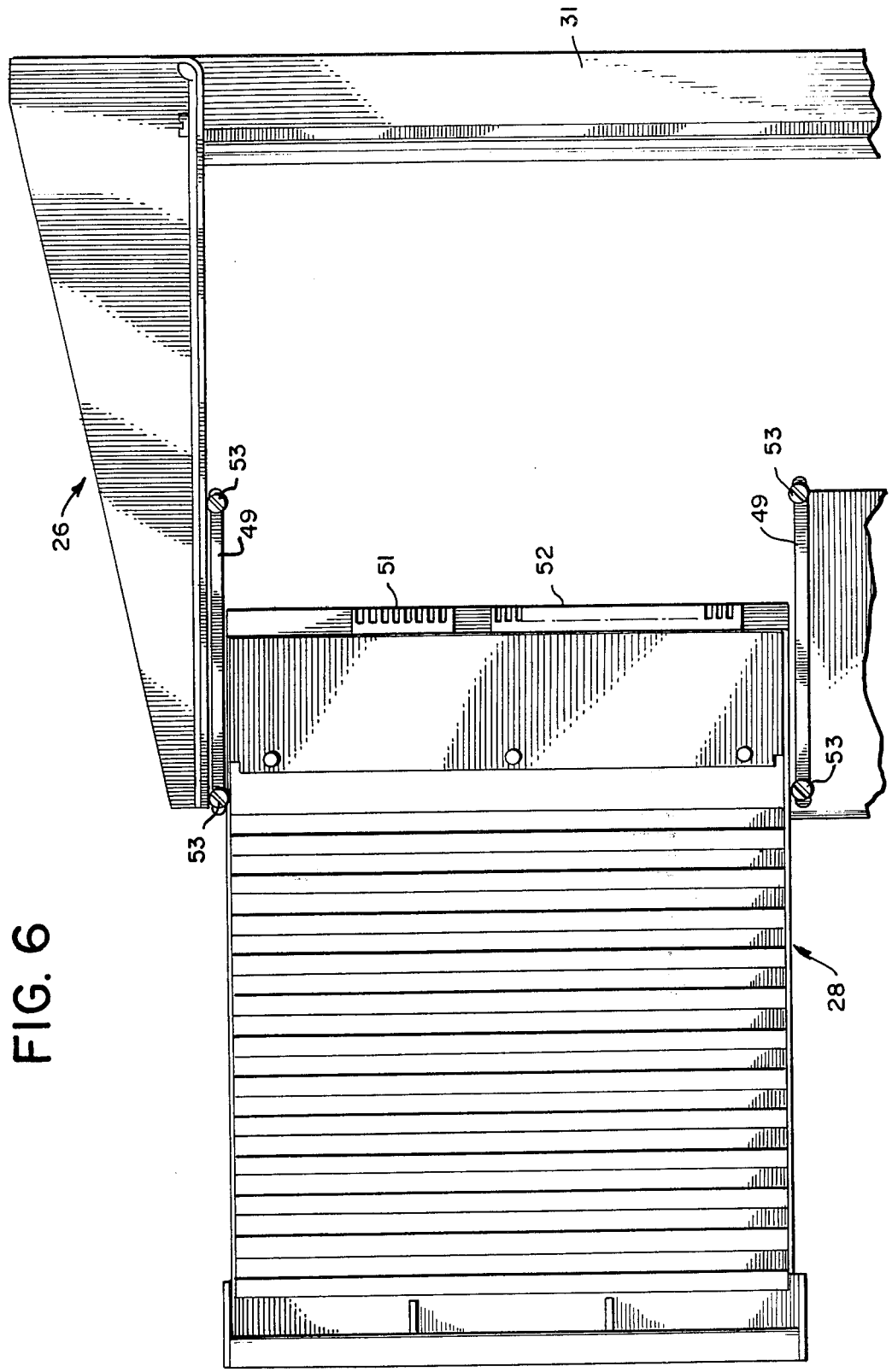

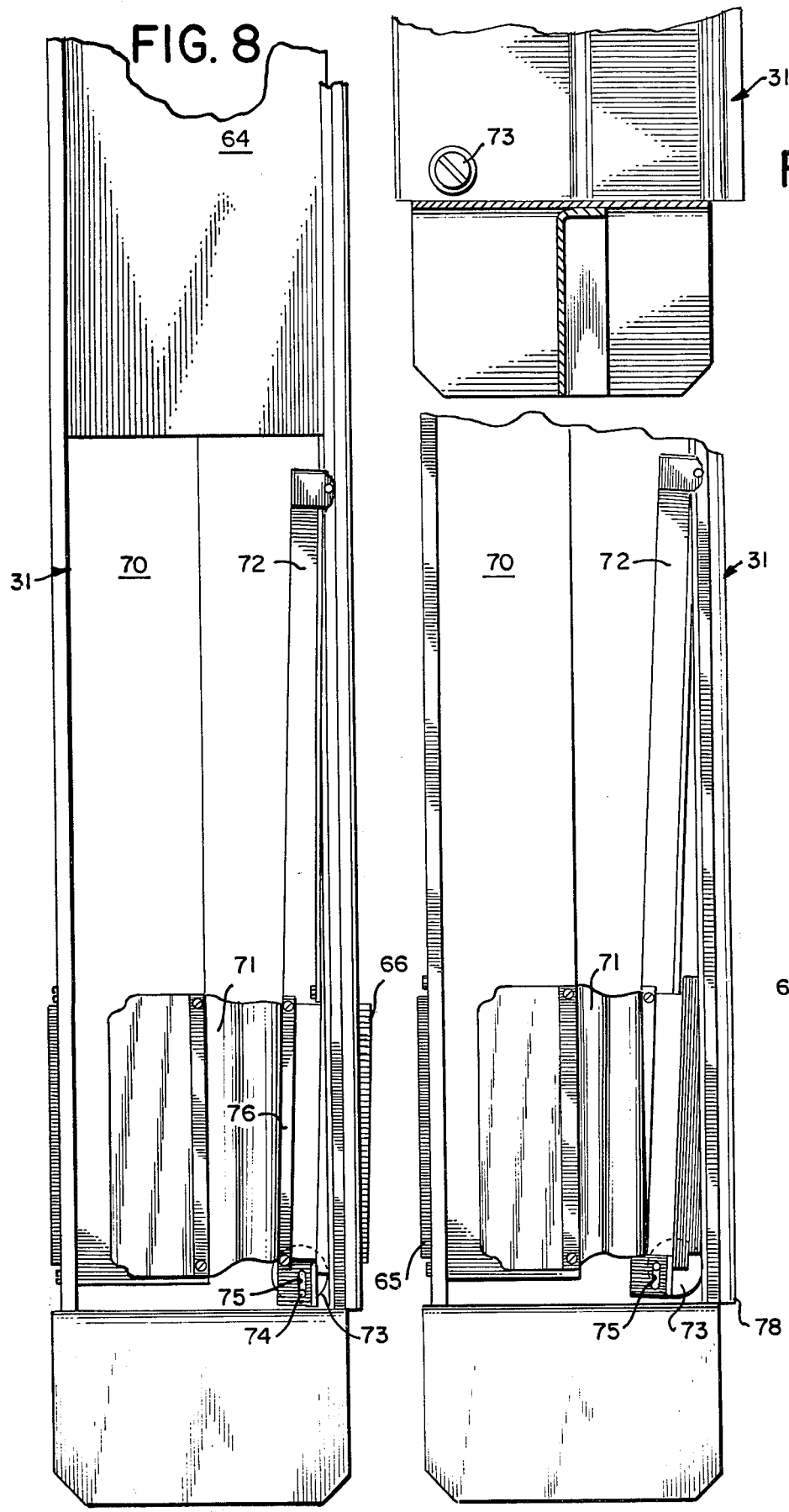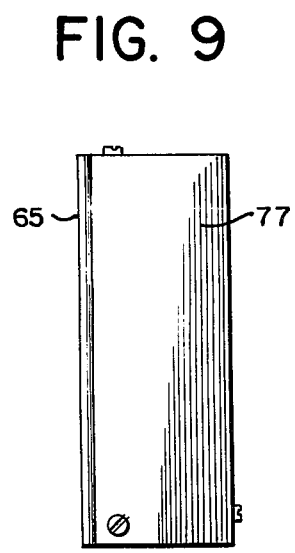

MODULAR PANEL CONSTRUCTION FOR PROGRAMMABLE CONTROLLER AND FRAME THEREFORE

SUMMARY OF THE INVENTION

This invention relates to programmable controllers, and more specifically to an input/output panel construction therefor.

In prior art programmable controllers, the input and output panels are generally constructed in a manner which requires the equipment connected thereto to be disconnected whenever the panels are removed, replaced, or in any way rearranged. As a result, a great effort must be expended in disconnecting the input and output terminals from the various equipment and then reconnecting them in the desired fashion. Furthermore, the replacement and removal of any input and output integrated circuit requires a great deal of effort along with the removal of the terminal wires from the various equipment relays.

Another problem with prior art programmable controllers is that whenever an input/output circuit needs to be replaced or repaired, the entire controller must be shut down in order to disconnect the necessary wiring. Clearly, this can result in a large amount of down time and adds to the burden of replacing and removing the input/output circuits. Furthermore, the input and output circuits channels were fixed and the particular address for the input or output circuit could not be easily changed.

Therefore, it is a principal object of this invention to provide an input/output panel construction which allows any input/output circuit to be quickly and easily removed and replaced without necessitating the removal of equipment wired thereto.

Another object of this invention is to provide the input/output panel construction of the above character which is both flexible and readily expandable to meet all operational conditions.

Another object of this invention is to provide the input/output panel construction of the above character wherein substantially all of the component parts are modularized and quickly and easily assembled and interconnected without shutting down the controller.

Another object of this invention is to provide the input/output panel construction of the above character which is completely expandable to meet all operational needs.

A further object of this invention is to provide an input and output panel construction of the above character wherein the address for the input and output circuit can be individually set for each input and output circuit board.

Other objects of the invention will in part be obvious and will in part appear hereinafter.

The input/output panel construction of this invention eliminates all of the drawbacks found in the prior art by providing an input/output housing which accommodates up to four plug-in input/output modules. The input/output modules accept standard machine AC or DC inputs from limit switches, pushbuttons, pressure switches, etc., and drive outputs such as solenoids, indicator lights, motor starters, etc.

The input and output lines from the user's equipment are connected to terminal strips on the housing itself, thus eliminating costly intermediate wiring. The input/output modules plug directly into the housing, interconnecting with the terminal strips without disturbing the equipment wiring. In this way, any input/output module can be plugged into the slot in the housing without the need for costly wiring changes. Also, any input/output module can be quickly and easily removed without necessitating removal of equipment wires connected to the terminals. This assures faster maintenance.

The versatility and expandability of the input/output panel construction of this invention is further enhanced by the input/output housing itself. As well as being able to accommodate up to four plug-in input/output modules, each input/output housing is constructed to be interconnectible with an adjacent input/output housing on either side of the housing. In this way, the input/output construction of this invention can be expanded to any desired size up to the capacity of the central processor.

The input/output housing also incorporates a selectable address for each module connected thereto, so that any particular address for the module can be preset. Furthermore, the addressing panel into which the module connects is easily removable from the housing frame in order to assure that maintenance can be quickly and easily achieved without disassembling the entire input/output housing.

The invention accordingly comprises the features of construction, combination of elements, and arrangement of parts which will be exemplified in the construction hereinafter set forth, and the scope of the invention will be indicated in the claims.

THE DRAWINGS

For a fuller understanding of the nature and objects of the invention, reference should be had to the following detailed description taken in connection with the accompanying drawings, in which:

FIG. 1 is a perspective view of the basic programmable controller incorporating the input/output panel construction of this invention;

FIG. 2 is a perspective view of the input/output housing of this invention with three input/output modules mounted in place and one module removed from the housing;

FIG. 6 is a side elevation view partially broken away of the input/output panel construction of this invention with the input/output module shown withdrawn from its normal operational position;

FIG. 8 is a rear elevation view of the input/output housing of this invention with the back cover partially removed showing the adjacent housing interconnecting pins partially extending out from the housing;

FIG. 9 is a rear elevation view partially broken away of the input/output housing of this invention with the adjacent housing interconnecting pins withdrawn; and FIG. 10 is a front elevation view partially broken away showing the control button for advancing and withdrawing the adjacent housing interconnection pins.

DETAILED DESCRIPTION

Figure 3:
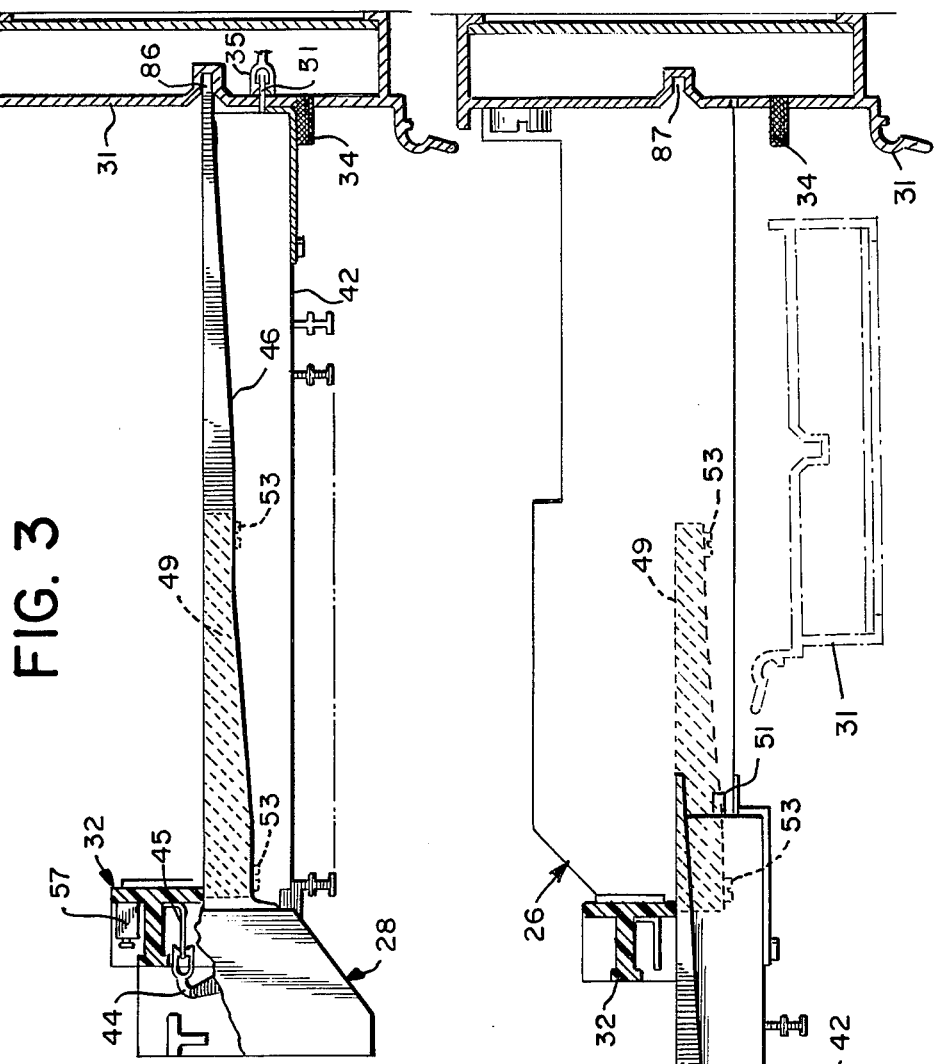
FIG. 3 is a cross-sectional top view of the input/output panel construction of this invention with the input output module mounted in place for operation.

In FIG. 1, a basic programmable controller 20 is shown which incorporates an input/output panel construction 22 of this invention. Programmable controller 20 also incorporates a power supply 24 and a central processor 25. As is well known in the art, controller 20 is constructed to receive information from various standard equipment, process this information and, in accordance with a particular program, provide output information which controls the various equipment connected thereto. Central processor 25 incorporates the desired program, receives the input information from the input modules of panel 22, processes this information, and delivers the output information to the output modules of panel 22.

Power supply 24 is connected to central processor 25, and drives central processor 25 as well as input/output panel construction 22.

As shown in FIG. 1, input/output panel assembly or construction 22 incorporates four interconnected input/output housings 26. Each housing 26 incorporates four input/output modules 28. Although input/output modules are discussed herein, this is for exemplary purposes only and any electronic module may be employed in the panel assembly of this invention. In the preferred embodiment, each module 28 incorporates either 16 inputs or 16 outputs. The particular nature of module 28, whether it is an input module or an output module, depends upon the particular electronic circuit mounted therein. Since each module incorporates 16 inputs or 16 outputs, each input/output housing 26 accommodates a total of 64 inputs and outputs. In order to increase this input/output capacity, input/output panel construction 22 can be expanded up to a maximum of four input/output housings 26. When the entire capacity of input/output panel construction 22 has been reached, there will be a total of 256 lines of inputs or outputs in any desired combination. This comprises one channel of the system. Since central processor 25 comprises an expandable memory capacity, additional channels can be incorporated into central processor 25 and additional input/output panel constructions are connectible thereto.

In FIG. 2, input/output housing 26 is shown with three input/output modules 28 mounted in place, and the fourth input/output module 28 removed. Input/output housing 26 comprises a supporting frame structure 30, a removable panel board 31 secured to frame 30, four terminal strips 32 for interconnection between input/output modules 28 and the user's equipment, and equipment wiring housing 33.

Panel board 31 incorporates an address selector system. The address selector system incorporates a rotatable knob 34, which is slidably engaged in slot 36. Knob 34 is interconnected with and controls a contact 35, which is slidably engaged in slot 37. By rotating knob 34 into a first position, knob 34 and contact 35 freely slide throughout their respective slots. When the desired address position is obtained, knob 34 is rotated to a second position, securing knob 34 and contact 35 in the desired address position.

Slot 36 incorporates eight distinct address positions, each of which is arcuately shaped in order to securely capture knob 34 when knob 34 has been set in a particular position. In this way, the desired address location selected is firmly retained and unwanted variation from this position is prevented. Panel board 31 also incorporates slot 38, which receives the contact pin from module 28, connecting that inserted module into the system.

For purposes of illustration, only one module 28 has been removed, showing the construction of panel 31 for interconnecting that module to the system. However, panel board 31 incorporates the same address-select system and receiving slot for each of the other three plug-in modules.

Input/output module 28 comprises a housing member 41, a cover 42, and a front panel 43. Secured within module 28 is an electronic assembly specifically designed for the particular information and equipment to which it will be connected. Generally, the electronic assembly will be either an input circuit or an output circuit, and will be designed for either DC or AC current. Furthermore, the particular electronic assembly is constructed to accommodate a particular current level.

Housing member 41 of module 28 incorporates a cam track 46 along its top and bottom sides. The particular operation of cam track 46 is fully described below. For added convenience, front panel 43 incorporates readily visible fuses 84 and an identification strip 85, on which the significance of each circuit line can be written. In this way, the fuse for each line of the circuit can be quickly and easily checked, as well as replaced, and any particular line can be quickly identified.

Cover 42 comprises a plurality of heat dissipating fins in order to assure trouble-free operation of the electronic assembly and complete dissipation of any heat that may be generated by the circuit.

Each input/output module 28 is constructed to be a plug-in module, which quickly and easily is insertable into input/output housing 26 and connectible thereto. Once inserted in position, module 28 is secured to housing 26 by threadedly engaging screw means 55 into holes 56.

Figure 5:
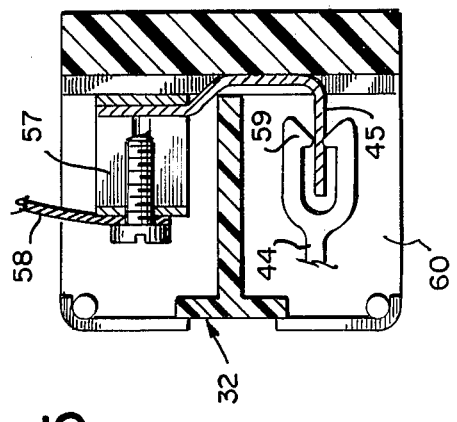
FIG. 5 is an enlarged cross-sectional top view of the terminal strip connector of the input/output housing of this invention.

The electronic assembly incorporated within module 28 comprises a plurality of contact forks 44. Contact forks 44 extend from the integrated circuit, and interconnect with cooperating contact pins 45 of terminal strip 32, best seen in FIGS. 3, 4, and 5.

Figure 4:
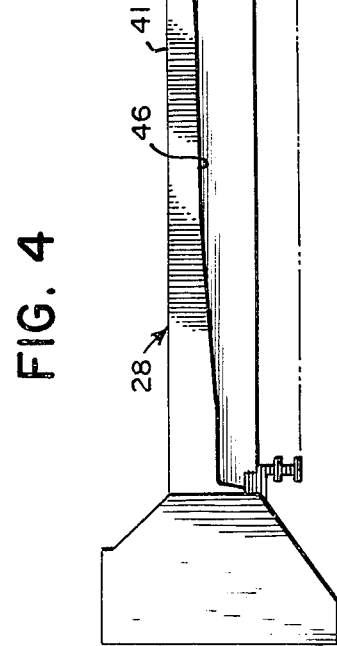
FIG. 4 is a cross-sectional top view of the input/output panel construction of this invention with the input/output module withdrawn from its mounted operational position.

In FIG. 4, plug-in module 28 is shown ready for installation in housing 26. Prior to installing module 28, knob 34 is adjusted and set into the desired address location preferred for the particular module. By referring to both FIGS. 4 and 6, the actual insertion of module 28 into housing 26 can best be understood.

Two portions of the integrated circuit which is contained within module 28 extend from module 28 along the rear thereof. As shown in FIG. 6, these extending portions of the integrated circuit comprise connecting pin sections 51 and 52. Pin section 51 comprises eight pins, which are inserted into slot 37, connecting with address-select contact 35. Pin section 52 is inserted into slot 38 and interconnects the 16 inputs or outputs provided by the particular integrated circuit with panel board 31.

In order to properly insert module 28, module 28 is positioned between dividers 49, which provide the desired alignment and position camming. As discussed above, input/output module 28 incorporates cam tracks 46 on both the top and bottom sides thereof. Cam tracks 46 cooperate with screws 53 of dividers 49. As module 28 is inserted into housing 26, the heads of screws 53 cooperate with cam tracks 46 of module 28, assuring that the module is positioned properly for interconnection with panel board 31 of housing 26.

As shown in FIG. 3, when module 28 is secured in its plugged-in position, the heads of screw 53 are in abutting contact with cam track 46. Also, pin section 51 contacts contact point 35, selecting the particular address for module 28. Additional proper alignment is assured by fin 86, which is part of housing member 41 of module 28 and is held in slot 87 of panel board 31.

When module 28 is mounted in its proper operational position, address selector knob 34 is in close proximity to cover 42 of module 28. This prevents alteration of the selected address without complete removal of module 28.

As discussed above, one of the major problems of prior art input/output panel constructions was that the input and output wiring from various equipment was wired directly to the input and output integrated circuits. As a result, when a particular integrated circuit was removed or replaced, all of the machine wiring had to be disconnected.

In the input/output panel construction of this invention, plug-in module 28 is constructed for fast and easy installation without requiring removal of input/output wiring of the user's equipment connected thereto. This quickly removable and replaceable feature of module 28 without necessitating the removal of equipment wiring from the module is provided by the construction of terminal strip 32 of housing 26 in cooperation with connecting forks 44 of module 28. The contstruction and operation of terminal strips 32 and connecting forks 44 can best be understood by referring to FIGS. 3 and 5.

Each terminal strip 32 comprises a plurality of contact pins 45, each of which is individually conductively connected to a single terminal clamp 57. Each set of pins 45 and clamp 57 are spaced apart by a plastic plate 60. Fork 44 of module 28 incorporates two prong members 59, which are spaced apart a distance slightly less than the thickness of contact pin 45 of terminal strip 32. Consequently, when module 28 is plugged into housing 26, prongs 59 of fork 44 are forced apart slightly by the thickness of pin 45. In this way, a conductive connection is assured between pin 45 and fork 44.

Wire 58 from the user's equipment is connected to terminal clamp 57. Once wire 58 has been so connected, wire 58 need not be disconnected. If module 28 must be removed or replaced for any reason, the module can be quickly and easily removed with fork 44 disconnecting itself from pin 45 without ever disturbing the connection between wire 58 and terminal clamp 57. A new module can be quickly and easily inserted in position, reconnecting itself to pin 45.

In the preferred embodiment, module 28 comprises 21 individual forks 44, and each terminal strip 32 comprises 21 individual pins 45 and terminal clamps 57. Although each module accommodates 16 inputs or 16 outputs, the additional five connection points are provided in order to allow for necessary line interconnections and power supply connections.

Figure 7:
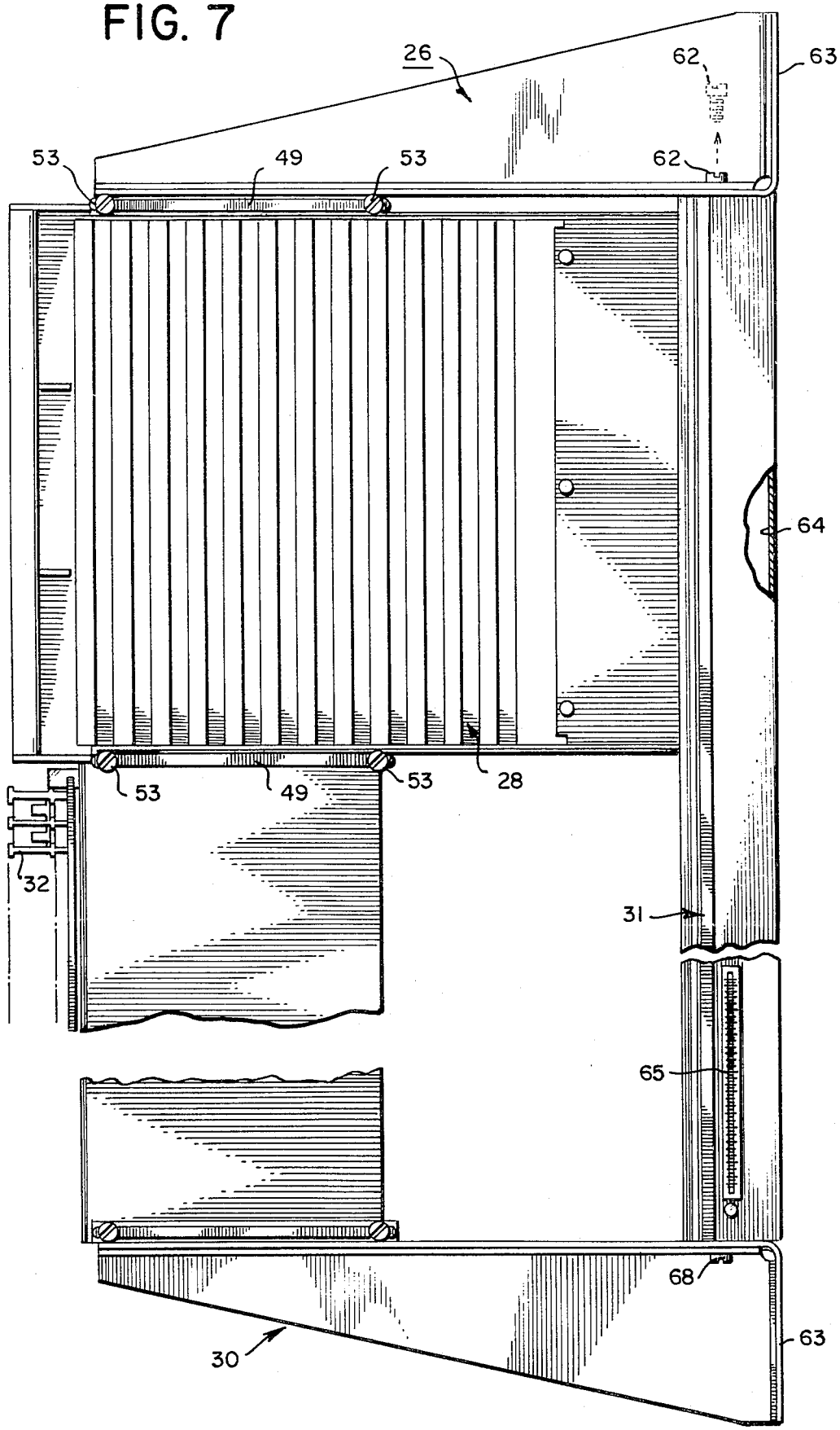
FIG. 7 is a side elevation view partially broken away of the input/output panel construction of this invention showing one plug-in module mounted in place.

As discusssed above, input/output housing 26 incorporates a removable panel board 31, which is interconnectable with adjacent panel boards in order to provide an input/output panel construction which comprises up to four interconnected housings. The removable feature of panel board 31 can best be understood by referring to FIG. 7. In FIG. 7, one input/output module 28 is shown mounted to housing 26. Panel board 31 is mounted to frame member 30 at the top and bottom of panel board 31 by screw means 62. In order to remove panel board 31, screw means 62 must merely be removed and panel board 31 will quickly and easily slide out from between frame members 30, as shown by the dashed lines in FIG. 4. Frame member 30 incorporates a mounting flange 63, which can be secured to any supporting structure in any desired location.

Panel board 31 incorporates along its rear side a removable cover 64. Also, panel board 31 incorporates a pin-receiving connector 65 near the base of one of its sides. The opposite side of panel board 31 comprises a cooperating strip of connecting pins 66, which can be removably extended or withdrawn as desired. Pins 66 are shown in FIG. 2 and FIG. 8. The interconnection of adjacent panel boards 31 can best be understood by referring to FIGS. 8, 9, and 10.

In FIG. 8, the rear of panel board 31 is shown with removable rear cover 64 partially withdrawn, in order to see the internal construction of panel board 31. Panel board 31 comprises an integrated circuit 70, which extends the entire length of panel board 31, and incorporates the necessary circuitry for interconnecting the input and output lines of each of the four modules connected thereto, while also providing the necessary addressing connection lines for transfer of information between each of the modules in their particular address and the central processing unit. At the base of integrated circuit 70, a flexible connection strip 71 is conductively secured thereto. The other end of flexible connection strip 71 is conductively connected to pins 66.

The movement of connection strip 71 along with the movement of pins 66 is controlled by lever 72, rotatable disc 73, and eccentrically mounted pin 74. Pin 74 is eccentrically mounted on drum 73, and is cooperatively associated with and captured by slot 75 of lever arm 72.

In operation, the rotation of drum 73 causes eccentrically mounted pin 74 to arcuately move in the direction of rotation of drum 73. The arcuate movement of pin 74 within slot 75 forces arm 72 to also move in the same lateral direction.

As a result, referring to FIGS. 8 and 9, clockwise rotation of drum 73 causes pin 74 and arm 72 to move to the left. Since arm 72 is rigidly secured to flexible connecting strip 71 by means of clamp means 76, flexible connecting strip 71 as well as connecting pins 66 similarly move to the left. When pin 74 has moved to the end of the possible arc provided by slot 75, pins 66 are completely withdrawn from exposure along the side of panel board 31. In the preferred embodiment, pin 74 has an arcuate rotational movement of 180°. FIG. 9 shows the completely withdrawn position for pins 66 with pin 74 at one end of its motion, and FIG. 8 shows pins 66 partly exposed with pin 74 halfway through its arcuate movement. In order to securely lock pins 66 in their completely extended position, pin 74 is rotated counterclockwise 90° from the position shown in FIG. 9.

As shown in FIG. 10, drum 73 is exposed on the front of panel board 31 and is slotted, in order to allow easy rotational movement of drum 73.

In operation, adjacent panel boards 31 would be mounted adjacent to each other with connection pins 66 in the withdrawn position. Once the mounting has been completed, drum 73 would be rotated 180°, allowing pins 66 to extend outwardly from panel board 31 and into the pin connector receiver 65 of the adjacent panel board.

Furthermore, at the end of each input/output panel construction, a connection to the central processing unit must be achieved. In order to accomplish this, a connection box 77 is provided, which incorporates a pin-receiving connector 65 therein. Connection box 77 is slid over, accommodating flanges 78 provided along the side of panel board 31, while pins 66 are withdrawn and, once connection box 77 is mounted in the desired position, drum 73 is rotated, allowing pins 66 to extend into connection receiver 65, making the desired contact.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. An input/output panel assembly interconnected with a central processor to form a machine controller interconnected with and operating external devices, comprising:
   A. a support frame;
   B. a terminal strip secured to said support frame at a first location and incorporating a set of contact pins communicating with said external devices;
   C. a panel board
      a. removably mounted to said support frame at a second location,
      b. electrically interconnectable with adjacent panel boards,
      c. incorporating a first set of pin-receiving means, and
      d. communicating with the central processor; and
   D. an electronic module removably mounted to said support frame and incorporating
      a. a plurality of contacts electrically interconnected with said plurality of contact pins of said terminal strip, and
      b. a second set of contact pins electrically connected to said first set of pin-receiving means of said panel board, whereby upon insertion of said electronic module in said support frame, said module is electrically connected between said external devices and said central processor.

2. The input/output panel assembly defined in claim 1, wherein each of said contact pins of said terminal strip comprises:
   a. a first contact frictionally interconnected with said removable electronic module, and
   b. a second contact and electrically connected with external equipment wiring, whereby removal or replacement of said electronic module can be made without disturbing the external equipment wiring.

3. The input/output panel assembly defined in claim 1, wherein said panel assembly is further defined as comprising a plurality of electronic modules incorporating at least one input module and at least one output module, with each of said modules removably mounted to said support frame and incorporating
   a. a plurality of contacts electrically interconnected with said plurality of contact pins of said terminal strip, and
   b. a second set of contact pins electrically connected to said first set of pin-receiving means of said panel board, whereby upon insertion of said electronic module in said support frame, said module is electrically connected between said external devices and said central processor.

4. The input/output panel assembly defined in claim 3 wherein said panel board comprises a plurality of address select means for pre-setting a particular electronic location for each of said modules.

5. The input/output panel assembly defined in claim 3, wherein each of said address select means incorporates an address contact pin electrically interconnected with address pins of said input and output modules, said address contact pin being
   a. slidably engaged with said panel board, and
   b. lockable in each of a plurality of address locations.

6. The input/output panel assembly defined in claim 1, wherein said panel board is further defined as comprising:
   a. a second set of pin-receiving means located along one side of said panel board, and
   b. a plurality of movable connecting pins disposed along the opposite side of said panel board and adapted for extendable electronic interconnection with the second set of pin-receiving means of an adjacent panel board and retractable disconnection from said second set of pin-receiving means of said adjacent panel board.

7. The input/output panel assembly defined in claim 1, wherein said panel board comprises:
   a. an integrated circuit adapted for interconnection with said electronic module,
   b. a flexible strip of conductive material connected at one end to said integrated circuit,
   c. a plurality of pins connected to the other end of said strip of conductive material,
   d. a movable arm, a portion of which is controllably secured to said flexible conductive material for controlled movement thereof, and
   e. a drum rotatably engaged in said panel board, and a pin eccentrically mounted to said drum and cooperatively connected to said arm for controlled movement of said arm upon rotation of said drum, whereby rotation of said drum and said pin causes said arm to move said flexible conductive strip and said pins connected thereto from a first completely withdrawn position to a second completely extended position.

8. The input/output panel assembly defined in claim 1, wherein said electronic module comprises:
   a. a housing member,
   b. a cover removably secured to said housing member,
   c. a front panel mounted to one end of said housing member,
   d. an integrated circuit securably mounted within said housing member and said cover, and c. a plurality of contact forks electronically connected at one end to said integrated circuit and removably electrically connected at their other end to said contact points of said terminal strip.

9. The input/output panel assembly defined in claim 7, wherein each of said plurality of contact forks of said module comprises two prongs, said prongs being
   a. in juxtaposed facing relationship to each other,
   b. spaced apart a distance less than the thickness of the contact points of the contact strip, and
   c. electrically interconnected with said contact point by insertion of said contact point between said prongs, whereby, upon interconnection of said contact forks with said contact points of the terminal strip, said prongs of said contact forks are slightly spread apart, thereby assuring an intimate electrically conductive contact between said contact forks and said contact points.

10. The input/output panel assembly defined in claim 7, wherein said housing member incorporates cam tracks along the top and bottom sides thereof, and said support frame incorporates spacer fins for proper orientation of said modules.

11. The input/output panel assembly defined in claim 9, wherein said spacer fins comprise screw means positioned for guiding alignment of said cam tracks of said module, assuring proper alignment of said module with said support frame and proper connection of said module with the panel board.

* * * * *

UNITED STATES PATENT OFFICE
CERTIFICATE OF CORRECTION

Patent No. 3,942,077          Dated March 2, 1976

Inventor(s) Howard A. Powers

It is certified that error appears in the above-identified patent and that said Letters Patent are hereby corrected as shown below:

Column 7, Line 32, delete "to form"

Insert -- and forming --

Signed and Sealed this fifteenth Day of June 1976

[SEAL]

Attest:

RUTH C. MASON
Attesting Officer

C. MARSHALL DANN
Commissioner of Patents and Trademarks